United States Patent
Bisanti et al.

(10) Patent No.: US 6,806,781 B2
(45) Date of Patent: Oct. 19, 2004

(54) TUNING CIRCUIT HAVING ELECTRONICALLY TRIMMED VCO

(75) Inventors: Biagio Bisanti, Antibes (FR); Francesco Coppola, Antibes (FR); Pascal Guignon, Callian Fayence (FR)

(73) Assignee: Texas Instruments Incorporated, Dallas, TX (US)

( * ) Notice: Subject to any disclaimer, the term of this patent is extended or adjusted under 35 U.S.C. 154(b) by 13 days.

(21) Appl. No.: 09/815,831

(22) Filed: Mar. 23, 2001

(65) Prior Publication Data

US 2002/0033739 A1 Mar. 21, 2002

(30) Foreign Application Priority Data

Sep. 15, 2000 (EP) .......... 00402561

(51) Int. Cl.[7] .......... H03L 7/00
(52) U.S. Cl. .......... 331/36 R; 331/177 V
(58) Field of Search .......... 331/177 V, 36 C, 331/36 R, 117 R, 1 A, 10, 11; 327/156, 157, 148

(56) References Cited

U.S. PATENT DOCUMENTS

| | | | |
|---|---|---|---|
| 5,182,528 A | 1/1993 | Zuta | 331/1 A |
| 5,686,864 A | 11/1997 | Martin et al. | 331/1 A |
| 5,721,517 A * | 2/1998 | Goma et al. | 331/117 R |
| 5,933,058 A * | 8/1999 | Pinto et al. | 331/17 |
| 5,936,474 A | 8/1999 | Rousselin | 331/34 |

FOREIGN PATENT DOCUMENTS

| | | |
|---|---|---|
| EP | 0 910 170 A | 4/1999 |
| WO | WO 00 67376 A | 11/2000 |

* cited by examiner

*Primary Examiner*—Benny Lee
*Assistant Examiner*—Joseph Chang
(74) *Attorney, Agent, or Firm*—Ronald O. Neerings; Wade James Brady, III; Frederick J. Telecky, Jr.

(57) ABSTRACT

A voltage controlled oscillator (38) includes an LC tank (20) and a capacitor bank (21). LC tank (20) includes an inductor (12) and a varactor (14). The capacitive output of the varactor is controlled by a control voltage v. To electronically tune the voltage controlled oscillator, a set of capacitors (24) in the capacitor bank (21) are enabled by a digital control signal based on a frequency comparison with a desired frequency. Once the capacitor bank is set, the frequency can be locked at the desired frequency by the phase lock loop.

22 Claims, 2 Drawing Sheets

TUNING CIRCUIT HAVING ELECTRONICALLY TRIMMED VCO

BACKGROUND OF THE INVENTION

1. Technical Field

This invention relates in general to electronic circuits and, more particularly, to a digitally controlled voltage controlled oscillator.

2. Description of the Related Art

Voltage controlled oscillators (VCOs) are used in a variety of electronic circuits. One particularly important application using VCOs is in mobile communications, where VCOs are used into the phase-locked loop system to generate the frequency with the desired precision and stability characteristic. VCOs are also used in a variety of other applications.

Typically, the VCO is formed on the circuit board using an LC tank including an inductor and a varactor. In order to ensure that the tuning range of the VCO is wide enough to cover the required bandwidth, and to compensate for the spread of other components, the tank formed on the circuit board is initially fabricated to cover a frequency range in excess of the optimum frequency range. During the manufacturing process, the tank is adjusted to cover an optimum frequency range by trimming the inductance Trimming the tank is a relatively expensive procedure, particularly for mass produced circuits, such as cellular transceivers. Further, trimming procedures require that the tank be formed on the circuit board rather than integrating the VCO on a chipset. This further increases the cost of the circuit using the VCO.

Therefore, a need has arisen for a VCO with a wide frequency range that does not require physical trimming.

BRIEF SUMMARY OF THE INVENTION

In the present invention, a voltage controlled oscillator comprises an inductive element, a variable capacitive element coupled to said inductive element and a bank of switched capacitors coupled to said inductive element and said variable capacitive element.

The present invention provides significant advantages over the prior art. First, the need to physically trim the inductor of the LC tank is eliminated. Second, the bank of switched capacitors can be set such that the VCO's free running frequency is close to the desired frequency in order to reduce the tuning range required to the varactor. This provides for fast tuning of a phase lock loop incorporating the voltage controlled oscillator. Third, the capacitor bank can be incorporated on an integrated circuit, reducing the cost of implementing the voltage controlled oscillator. Fourth, the capacitors in the bank can have very small values, providing very precise tuning.

The present invention allows the effective tuning range of the VCO can remain broad, while the tuning range attributable to the varactor can remain small. Therefore, a high sensitivity is not required to achieve a broad tuning range. With a lower VCO sensitivity, better noise performances can be achieved and it is easier to integrate the varactor of the tank on an integrated circuit. Integration of RF (radio frequency) VCOs in systems for cellular applications, or other mass produced products, is important because of the significant cost and power savings from eliminating discrete components. Further, the noise immunity of the board is improved.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1–6 of the drawings, like numerals being used for like elements of the various drawings.

Figure 1:
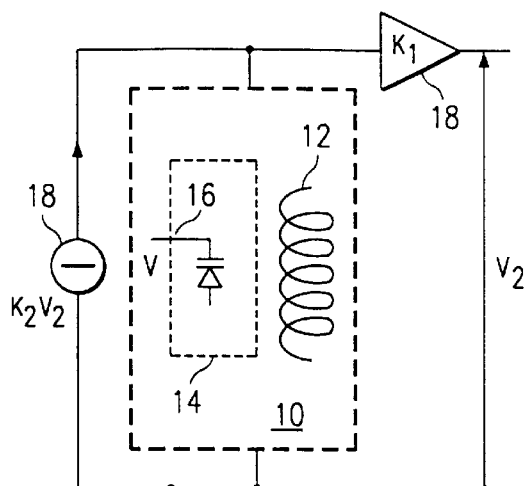
FIG. 1 a schematic of a prior art LC tank VCO.

FIG. 1 illustrates a schematic of a prior art LC tank 10. LC tank 10 includes an inductor 12 coupled to varactor 14. A variable voltage (v) at node 16 controls varactor 14. The active stage 18 is provides the energy necessary to sustain the oscillation.

Figure 2:
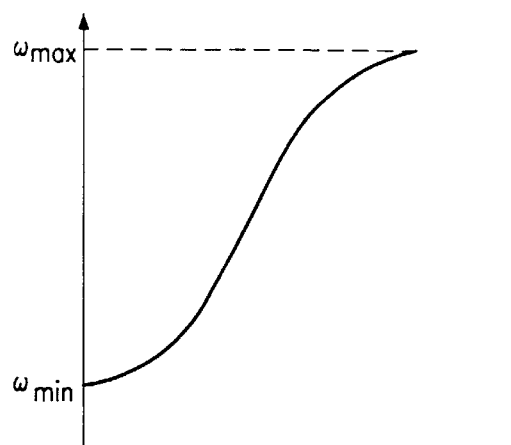
FIG. 2 illustrates the tuning range associated with the circuit of FIG. 1.

In operation, the LC tank 10 produces a frequency $\omega=(LC(v))^{-1/2}$, where L is the inductance of inductor 12, and $C(v)$ is the capacitance of varactor 14 as a function of control voltage v. FIG. 2 shows the output frequency $\omega$ of the circuit as a function of v.

The LC tank 10 can produce frequencies in the range between $\omega_{min}=(LC_{max})^{-1/2}$ and $\omega_{max}=(LC_{min})^{-1/2}$, where $C_{min}$ and $C_{max}$ are the capacitive limits of the varactor. To cover a wide frequency range, the inductor 12 may be oversized, and then trimmed to optimize performance with the other components on the system. However, this can be a very costly procedure, especially for mass produced parts. Further, the inductor 12 must be fabricated on the circuit board, rather than on an integrated circuit, in order to allow for trimming.

Figure 3:
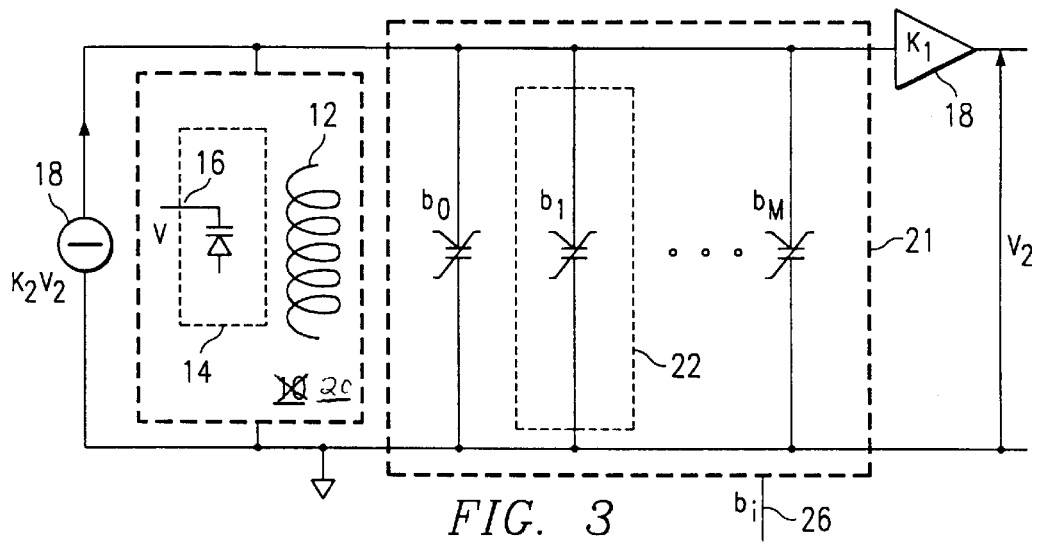
FIG. 3 illustrates a preferred embodiment of an LC tank with a capacitor bank.

FIG. 3 illustrates a schematic of an LC tank 20 with an additional capacitor bank used in the present invention. As in FIG. 1, the LC tank includes an inductor 12 coupled with varactor 14. The variable voltage (v) at node 16 controls varactor 14. The active stage 18 is used to provide the energy necessary to sustain the oscillation. In addition, a bank 21 of switched capacitors 22 is coupled in parallel with varactor 14. Each switched capacitor can be considered as a capacitance whose value can be either $C_{on}$ or $C_{off}$ according to the value of a digital control signal bi.

Accordingly, the capacitance of tank 20 equals $C(v)+m C_{on}+(M-m) C_{off}$, where m is the number of capacitors enabled by the digital control signal. It is assumed herein that each capacitor has the same, or close to the same value of $C_{on}$ and $C_{off}$. However, it would also be possible to design bank 21 with capacitors of different values of $C_{on}$ and $C_{off}$. For example, a bank of capacitors could have values of $1 \times C_{on/off}$, $2 \times C_{on/off}$, $4 \times C_{on/off}$, $8 \times C_{on/off}$, and so on.

Figure 4:
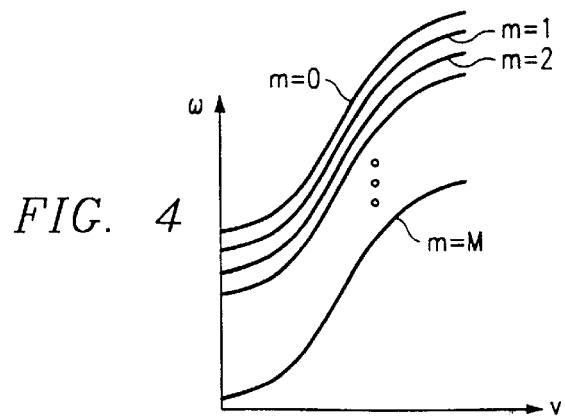
FIG. 4 illustrates a set of tuning ranges associated with the LC tank of FIG. 3.

The frequency (in radians/sec) of tank 20 is thus equal to $\omega=(L(C(v)+mC_{on}+(M-m)C_{off}))^{-1/2}$. For a given value of m, the frequency will vary between $\omega_{min}=(L(C_{max}+C_B))^{-1/2}$ and $\omega_{max}=(L(C_{min}+C_B))^{-1/2}$, where $C_B=mC_b$ and V is the maximum value of v. The frequency as a function of v is different for each value of m, where 0<=m<=M and M is the total number of capacitors 22 in the bank 21, as shown in FIG. 4. Accordingly, the frequency range of tank 20 can be varied as desired by adjusting the number of enabled switched capacitors 22 in bank 21.

Figure 5:
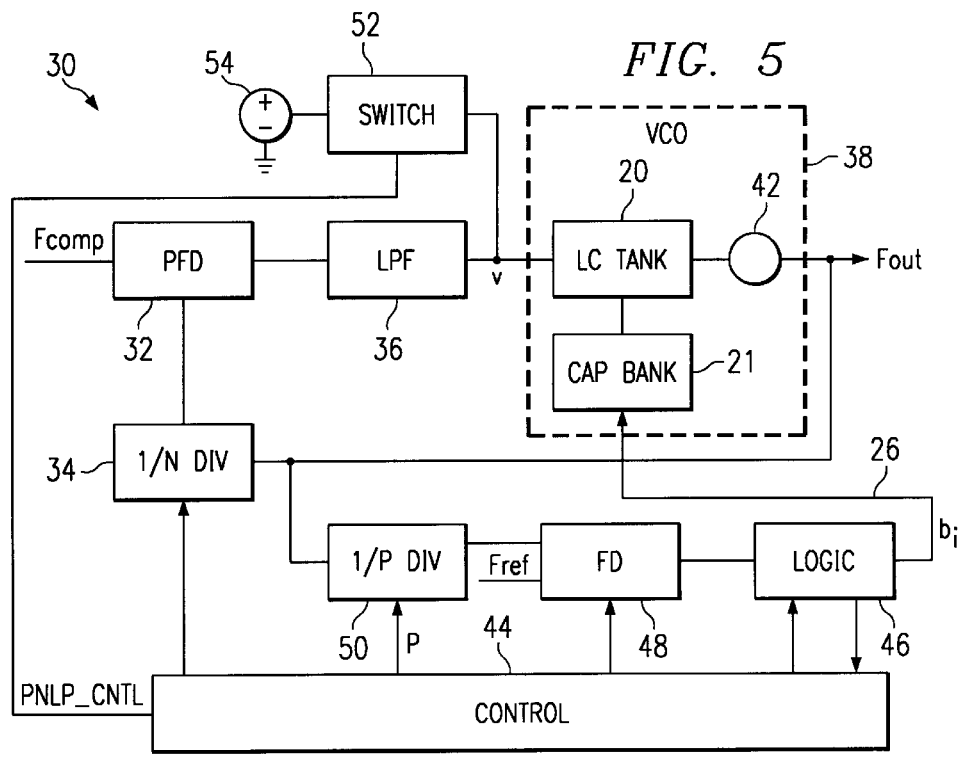
FIG. 5 illustrates a block diagram of a first circuit using the LC tank of FIG. 3.

FIG. 5 illustrates a block diagram of a first embodiment tuning circuit 30, which may be used, for example, in cellular applications. A first frequency, $F_{comp}$ is input to a PFD (phase frequency detector) 32, along with the output of frequency divider 34. The output of the PFD 32 is coupled to the input of a low pass filter (LPF) 36. The output of LPF 36, the varactor control voltage v, is input to a voltage controlled oscillator (VCO) 38. VCO 38 includes tank 20, capacitor bank 21 and active section 42. The output of VCO 38 is the $F_{out}$ signal. The $F_{out}$ signal is coupled to a frequency divider 34, which divides the $F_{out}$ signal by a factor of N. The value of N is controlled by control circuitry 44.

Control circuitry 44 is also coupled to logic 46, frequency detector 48 and frequency divider 50, which divides the $F_{out}$ signal by a factor P (set by control circuitry 44). The output of frequency divider 50 is coupled to frequency detector 48 along with an $F_{ref}$ signal. The output of logic 46 is sent to capacitor bank 21 to enable the desired combination of capacitors. Control circuitry 44 also sends a control signal (PNLP_CNTL) to a switch 52 that selectively couples a voltage from voltage source 54 to the varactor 14 in LC tank 20.

In operation, the VCO 38 is set to an optimum setting (the trimming stage) upon certain events. For example, if used in a cellular phone, the VCO 38 could be set to optimum settings each time the channel was changed. To obtain optimum settings, v is initially set to a desired value by control circuitry 44, for example to a value that places varactor 14 in the middle of its capacitive range [i.e., $(C_{max}-C_{min})/2$], by enabling switch 52. This will provide a certain $F_{out}$, which will be divided by factor P (set by control circuitry 44) and compared to a reference frequency $F_{ref}$. Frequency detector 48 outputs a control signal indicative of the difference between $F_{out}/P$ and $F_{ref}$. If frequency detector 48 indicates that $F_{out}/P$ is greater than $F_{ref}$, then logic circuitry 46 will increase the capacitance in capacitor bank 21 by enabling additional capacitors 24. Logic 46 will continue to increase the capacitance from bank 21 until the output of frequency detector 48 reaches a specified precision. Once an acceptable precision has been reached, the state of the digitally trimmed capacitance is stored in a register and held until the next event.

Once the capacitance from bank 21 is set, switch 52 is disabled. When switch 52 is disabled, variations in the capacitance of VCO 38 are controlled by the output of phase frequency detector 32, which compares $F_{out}/N$ with $F_{comp}$ and generates a voltage corresponding to the differences in frequencies. Phase frequency detector 32, low pass filter 36 and frequency divider 34 form a phase lock loop (PLL) with VCO 38. Differentials between $F_{comp}$ and $F_{out}/N$ cause phase frequency detector 32 to vary v such that the capacitance from varactor 14 adjusts the frequency of VCO 38 to the desired value.

Because the capacitors in bank 21 can be integrated on an integrated circuit, and hence provide very small increments in the trimming stage, $F_{out}$ should be very close to the desired frequency when the phase lock loop is enabled. Therefore, the PLL will lock quickly.

Figure 6:
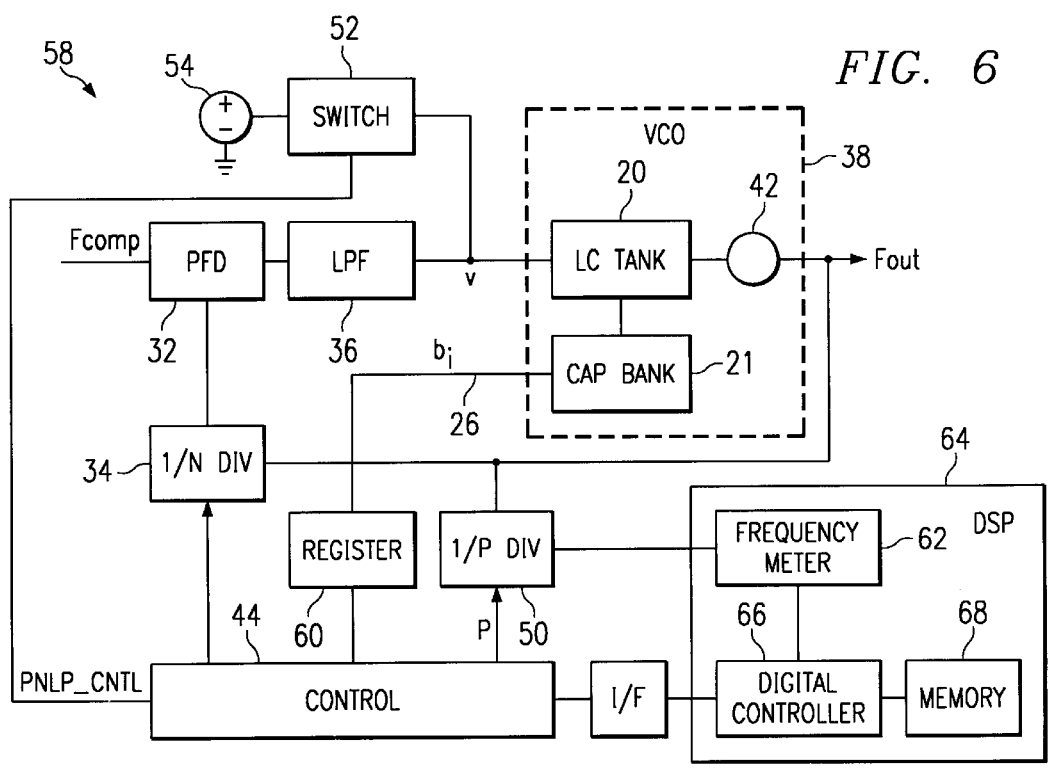
FIG. 6 illustrates a block diagram of a second circuit using the LC tank of FIG. 3.

FIG. 6 illustrates a block diagram of a second embodiment of a tuning circuit using the VCO of FIG. 3. This embodiment could also be used in cellular applications. This embodiment uses a DSP or other processor to control the trimming stage.

In FIG. 6, $F_{comp}$ is input to phase frequency detector 32, along with the output of frequency divider 34. The output of the PFD 32 is coupled to the input of a low pass filter 36. The output of LPF 36, the varactor control voltage v, is input to the voltage controlled oscillator (VCO) 38. VCO 38 includes tank 20, capacitor bank 21 and active section 42. The output of active section is the $F_{out}$ signal. The $F_{out}$ signal is coupled to a frequency divider 34, which divides the $F_{out}$ signal by a factor of N. The value of N is controlled by control circuitry 44.

Control circuitry 44 is also coupled to frequency divider 50, which divides the $F_{out}$ signal by a factor P, and a register 60. The output of frequency divider 50 is coupled to frequency meter 62, which is internal to DSP 64. The output of frequency meter 62 is output to the DSP's digital controller 66, which is coupled to the DSP's memory 68 and to control circuitry 44 via interface 70. Register 60 stores a value to enable the desired combination of capacitors 22 in bank 21. Control circuitry 44 also sends a control signal (PNLP_CNTL) to a switch 52 that selectively couples voltage source 54 to varactor 14 in LC tank 20.

In the embodiment of FIG. 6, the voltage source 54 is coupled to the varactor 14 to initiate the trimming phase. Frequency divider 50 divides $F_{out}$ by a factor of P (set by control circuitry 44) and outputs $F_{out}/P$ to frequency meter 62. Frequency meter 62 determines the degree of variation from a desired frequency and outputs this difference to digital controller 66. Based on the differential, digital controller does a lookup to memory 68 to determine how much capacitance should be enabled in bank 21 to optimize operation of oscillator 38. A number indicating the proper capacitive value for bank 21 is sent to control circuitry 44 via interface 70. Register 60 stores the information for controlling bank 21. Changes to the enabled capacitors 24 in bank 21 will cause $F_{out}$ to change. The new $F_{out}$ will be divided by frequency divider 50 and the divided signal is sent to frequency meter 62. Digital controller 66 will continue to adjust the capacitance of bank 21 until $F_{out}$ is within an acceptable range of a desired frequency.

Once the voltage controlled oscillator is trimmed and the information is stored in register 60, switch 52 is disabled and the varactor 14 is controlled by the voltage output of the phase frequency detector 32. Thereafter, the phase lock loop can set $F_{out}=F_{comp}*N$, as described above.

With the voltage controlled oscillator of FIG. 5, the trimming phase is preferably performed each time the PLL is reprogrammed. The trimming phase can be used to significantly speed up the settling time. In the embodiment shown in FIG. 6, the trimming is performed before starting an operation, with the voltage controlled oscillator having enough tuning range to cover all of the desired channels.

The present invention provides significant advantages over the prior art. First, the need to mechanically trim the inductor of the LC tank is eliminated. Second, a very accurate frequency resolution can be obtained by using the switching capacitors of bank 21, therefore the varactor with a low tuning range may be used; this makes the architecture very suitable for integration. Third, the tuning range of the VCO can be optimized for a given desired output frequency band without accounting for a large margin due to component spread. This provides for fast tuning of a phase lock loop incorporating the voltage controlled oscillator. Fourth, the capacitor bank can be incorporated on an integrated circuit, reducing the cost of implementing the voltage controlled oscillator.

Importantly, the trimming loop selects one of a plurality of frequency tuning ranges, as shown in FIG. 4. This can be done each time the system is powered up, or in response to a perturbation of the system. During normal operation, no other trimming cycle is required. The PLL will lock the VCO to the correct frequency.

With a lower varactor sensitivity, better noise performances can be achieved and it is easier to integrate the varactor of the tank on an integrated circuit. Integration of RF (radio frequency) VCOs in systems for cellular applications, or other mass produced products, is important because of the significant cost and power savings from eliminating discrete components. Further, the noise immunity of the board is improved.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

What is claimed is:

1. A tuning circuit, comprising:
a phase frequency detector having a first input, a second input, and an output;
a filter coupling said output of said phase detector to an input of a voltage controlled oscillator (VCO) said voltage controlled oscillator comprising:
an inductive element coupled to said input of said voltage controlled oscillator;
a variable capacitive element coupled to said inductive element; and
a bank of switched capacitors coupled to said inductive element and said variable capacitive element; and
a frequency divider coupling said second input of said phase frequency detector to an output of said voltage controlled oscillator (VCO).

2. The voltage controlled oscillator of claim 1 wherein each switched capacitor has a capacitance value that can be switched from a first value to a second value responsive to a digital control signal.

3. The voltage controlled oscillator of claim 1 wherein said variable capacitive element comprises a varactor.

4. The voltage controlled oscillator of claim 3 wherein said switched capacitors are integrated on an integrated circuit.

5. The voltage controlled oscillator of claim 1 and further comprising an amplifier coupled to said inductive element, said variable capacitive element and said bank of switched capacitors.

6. The voltage controlled oscillator of claim 1 and further comprising control circuitry for enabling a set of said switched capacitors responsive to a desired frequency.

7. The tuning circuit of claim 1, wherein said filter is a low pass filter.

8. The tuning circuit of claim 1, wherein said first input is coupled to receive a signal having a first frequency.

9. The tuning circuit of claim 1, wherein a signal having a second frequency is output at said output of said voltage controlled oscillator (VCO).

10. The tuning circuit of claim 9, wherein said frequency divider divides said second frequency by a factor of N.

11. A tuning circuit, comprising:
a phase frequency detector having a first input, a second input, and an output;
a filter coupling said output of said phase detector to an input of a voltage controlled oscillator (VCO), said voltage controlled oscillator comprising:
an inductive element coupled to said input of said voltage controlled oscillator;
a variable capacitive element coupled to said inductive element; and
a bank of switched capacitors coupled to said inductive element and said variable capacitive element;
a frequency divider coupling said second input of said phase frequency detector to an output of said voltage controlled oscillator; and
control circuitry for enabling a set of said switched capacitors responsive to a desired frequency, wherein said control circuitry comprises frequency comparison circuitry for comparing an output frequency of the voltage controlled oscillator with a reference frequency.

12. The voltage controlled oscillator of claim 11 wherein said frequency comparison circuitry is integrated on a digital signal processor.

13. The voltage controlled circuitry of claim 11 wherein said control circuitry further comprises logic for changing said set of capacitors responsive to an output of said frequency comparison circuitry.

14. A tuning circuit, comprising:
a phase frequency detector having a first input, a second input, and an output;
a filter coupling said output of said phase detector to an input of a voltage controlled oscillator (VCO);
a frequency divider coupling said second input of said phase frequency detector to an output of said voltage controlled oscillator (VCO);
logic circuitry coupled to said voltage controlled oscillator (VCO); and
a second frequency divider coupling said output of said voltage controlled oscillator (VCO) to a frequency detector, said frequency detector being further coupled to said logic circuitry.

15. The tuning circuit of claim 14, further including a switch coupling a voltage source to said input of said voltage controlled oscillator (VCO).

16. The tuning circuit of claim 15, further including control circuitry coupling said second frequency divider, said frequency detector, and said logic circuitry to said switch and said first frequency divider.

17. A tuning circuit, comprising:
a phase frequency detector having a first input, a second input, and an output;
a filter coupling said output of said phase detector to an input of a voltage controlled oscillator (VCO);
a frequency divider coupling said second input of said phase frequency detector to an output of said voltage controlled oscillator (VCO);
a second frequency divider coupled to said output of said voltage controlled oscillator (VCO); and
a switch coupling a voltage source to said input of said voltage controlled oscillator (VCO).

18. The tuning circuit of claim 17, further including control circuitry coupling said switch to said frequency divider and said second frequency divider.

19. The tuning circuit of claim 18, further including a register coupling said control circuitry to said voltage controlled oscillator (VCO).

20. The tuning circuit of claim 18, further including a digital signal processor (DSP) coupled to said second frequency divider.

21. The tuning circuit of claim 20, further including an I/F circuit coupling said control circuitry to said digital signal processor (DSP).

22. The tuning circuit of claim 21, wherein said digital signal processor (DSP) comprises a frequency meter coupling said second frequency divider to a digital controller, said digital controller coupling said I/F circuit to a memory.

* * * * *